Figure 1:
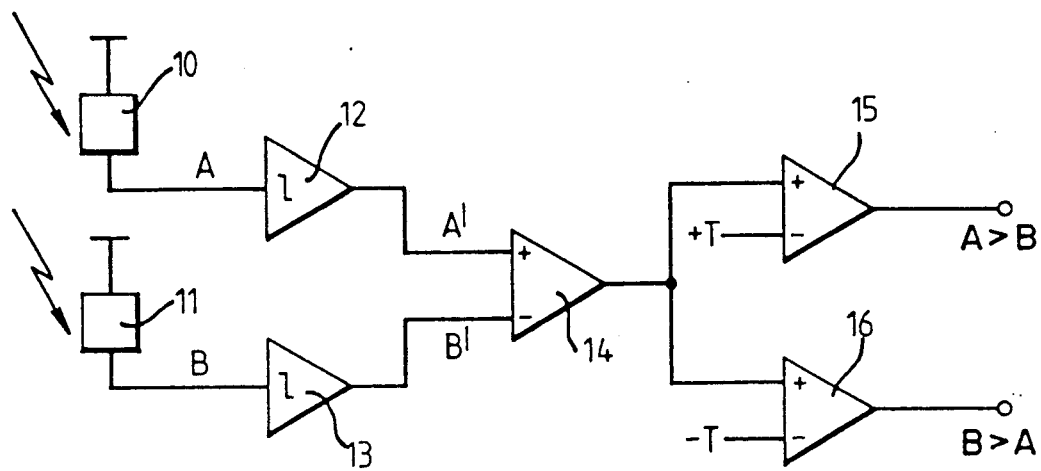

United States Patent [19]

Howie

[11] Patent Number: 5,047,667
[45] Date of Patent: Sep. 10, 1991

[54] VOLTAGE DIFFERENCE DETECTOR

[75] Inventor: James B. Howie, Edinburgh, Scotland

[73] Assignee: GEC Ferranti Defence Systems Limited, Stanmore, England

[21] Appl. No.: 467,563

[22] Filed: Jan. 19, 1990

[30] Foreign Application Priority Data

Jan. 21, 1989 [GB] United Kingdom ................. 8901332

[51] Int. Cl.$^5$ ............................................. H03K 5/24
[52] U.S. Cl. .................................... 307/355; 307/351; 307/358; 328/147
[58] Field of Search ............... 307/350, 351, 355, 356, 307/357, 358, 364, 360; 328/147

[56] References Cited

U.S. PATENT DOCUMENTS

| | | | |
|---|---|---|---|
| 3,593,285 | 7/1971 | Gillmann | 307/357 |
| 3,916,325 | 10/1975 | Lund | 328/147 |
| 4,419,595 | 12/1983 | Reiner | 328/147 |
| 4,435,683 | 3/1984 | Erickson | |
| 4,583,010 | 4/1986 | Brentnall | 307/357 |

FOREIGN PATENT DOCUMENTS

| | | |
|---|---|---|
| 0176165 | 4/1986 | European Pat. Off. |
| 997698 | 7/1965 | United Kingdom |
| 1231618 | 5/1971 | United Kingdom |
| 1315046 | 4/1973 | United Kingdom |
| 1462198 | 1/1977 | United Kingdom |

Primary Examiner—John Zazworsky
Attorney, Agent, or Firm—Kerkam, Stowell, Kondracki & Clarke

[57] ABSTRACT

A circuit is provided to detect which of a simultaneous plurality of varying input signals has the dominant maximum amplitude. Two simultaneous input signals are compared with each other; or each of more than two simultaneous input signals is compared individually with a common, varying, comparing signal, provided in response to the summing of the input signals, and the subsequent scaling of the summation. The input signals, and a provided comparing signal, are different from each other, only, in amplitude. Normally there is expected, at least in relation to the input signal having the dominant maximum amplitude, to be a wide dynamic extent of amplitudes; whereas each signal supplied to a difference amplifier for such a comparison is arranged to have only a low amplitude, at least the dominant input signal being supplied so as to have only a range of amplitudes, as transmitted by an associated limiting amplifier in response to the receipt of the signal. The rate of change with time of a varying signal amplitude, resulting from each comparison of two signals, substantially is proportional to the difference between the maximum amplitudes of the signals compared. Thus, the detector is arranged so as not to be required to operate upon the whole of said normally expected wide dynamic extent of amplitudes of at least the dominant input signal.

5 Claims, 2 Drawing Sheets

VOLTAGE DIFFERENCE DETECTOR

This invention relates to electrical detector circuits each to detect which of a simultaneous plurality of varying input signals has the dominant maximum amplitude. In particular, the present invention relates to such electrical detector circuits each arranged to receive a simultaneous plurality of varying input signals, which input signals are different from each other only in amplitude. Thus, the simultaneous plurality of varying input signals are required to be caused by a common source, to have waveforms of the same shape, and to be in phase with each other.

For some applications it is required to detect which of a simultaneous plurality of input signals from a common source has the dominant maximum amplitude, each such input signal varying over a wide dynamic extent, say, of twelve orders. Receivers and detectors saturate when in receipt of signals of high levels, and it is difficult to determine the maximum amplitudes of input signals at the upper extremities of such wide dynamic extents. It is known to employ automatic gain control or attenuation control techniques to reduce the dynamic range of signals to that of receivers to receive such signals. However, the means so to reduce the dynamic extent of signals is complex, and in the case of automatic gain control means it can only operate upon a series of input signals over a finite time period, and not upon individual input signals.

For other applications it is required to detect which of a simultaneous plurality of input signals has the dominant maximum amplitude, and is the only one of the plurality of input signals varying over a wide dynamic extent. Each of the other input signals of said plurality of simultaneous input signals comprises a spurious varying input signal, required to be distinguished from the dominant varying input signal. The dominant varying input signal can conveniently be considered to be the sole input signal from a source, although the spurious varying input signals also emanate from the same source; and the spurious varying input signals can be considered as differing from the dominant varying input signal, only, in amplitude, as referred to above.

It is an object of the present invention to provide an electrical detector circuit, of an advantageously simple form, and capable of determining which of a simultaneous plurality of input signals, has the dominant maximum amplitude, the input signals being different from each other only in amplitude, the amplitude of at least the dominant input signal varying over a dynamic range wider than the dynamic range of a circuit, co-operating with the detector.

According to the present invention, an electrical detector circuit arranged to detect which of a plurality of simultaneous varying input signals has a dominant maximum amplitude, the input signals being expected to have a wide dynamic range of amplitudes relative to whichever of said input signals has the dominant maximum amplitude and differing from one another only in amplitude, which detector circuit includes a separate limiting amplifier associated with each input signal and arranged to provide an output signal having an amplitude limited, when saturation of the amplifier occurs, to a value less than the said dominant maximum amplitude, and comparison means for comparing each said output signal with a variable comparing signal which differs from each input signal only in amplitude and having a rate of change related to the difference between the maximum amplitudes of the input signals, the arrangements being such that there is provided an indication of which of the simultaneous input signals has the dominant maximum amplitude.

Thus, a detector circuit in accordance with the present invention has an advantageously simple form, but is capable of determining which of a simultaneous plurality of input signals has the dominant maximum amplitude, without being required to operate upon the whole of the normally expected wide dynamic extent of input signal amplitudes.

Figure 3:
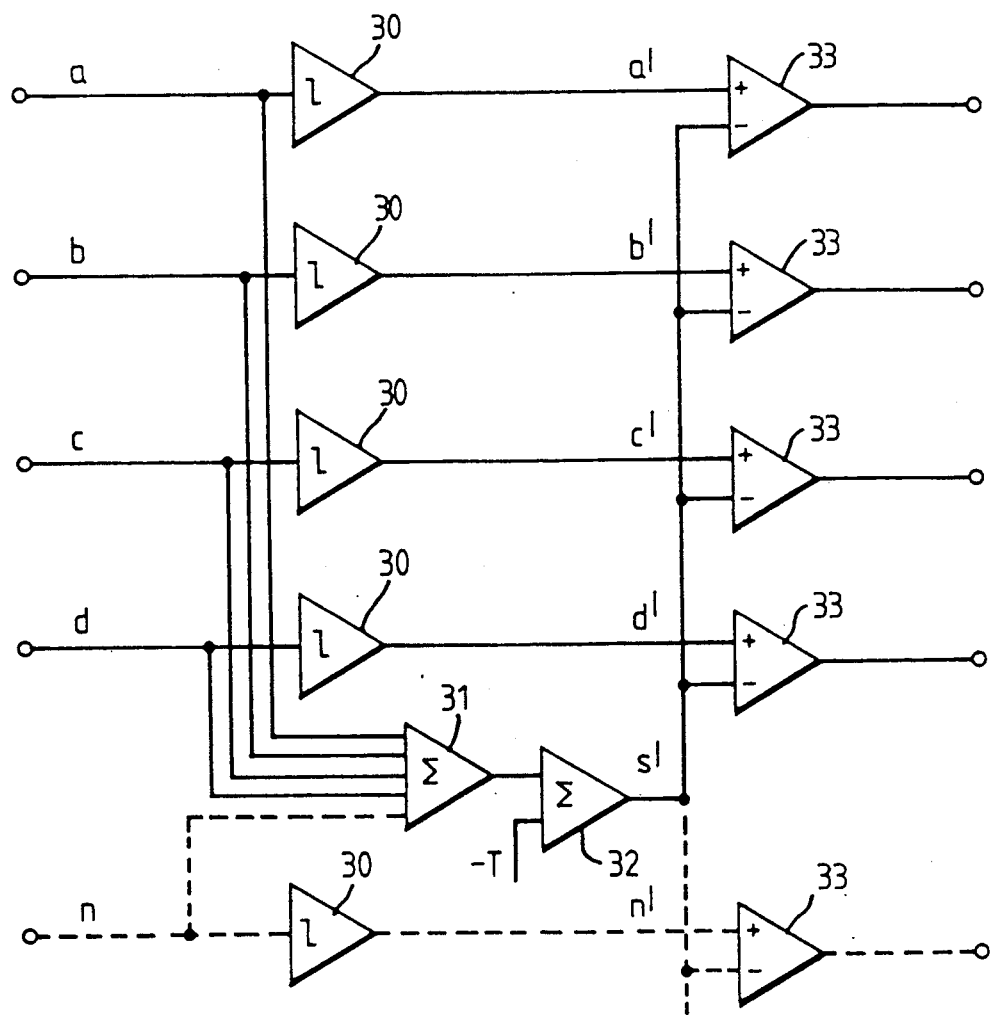
Figure 2:
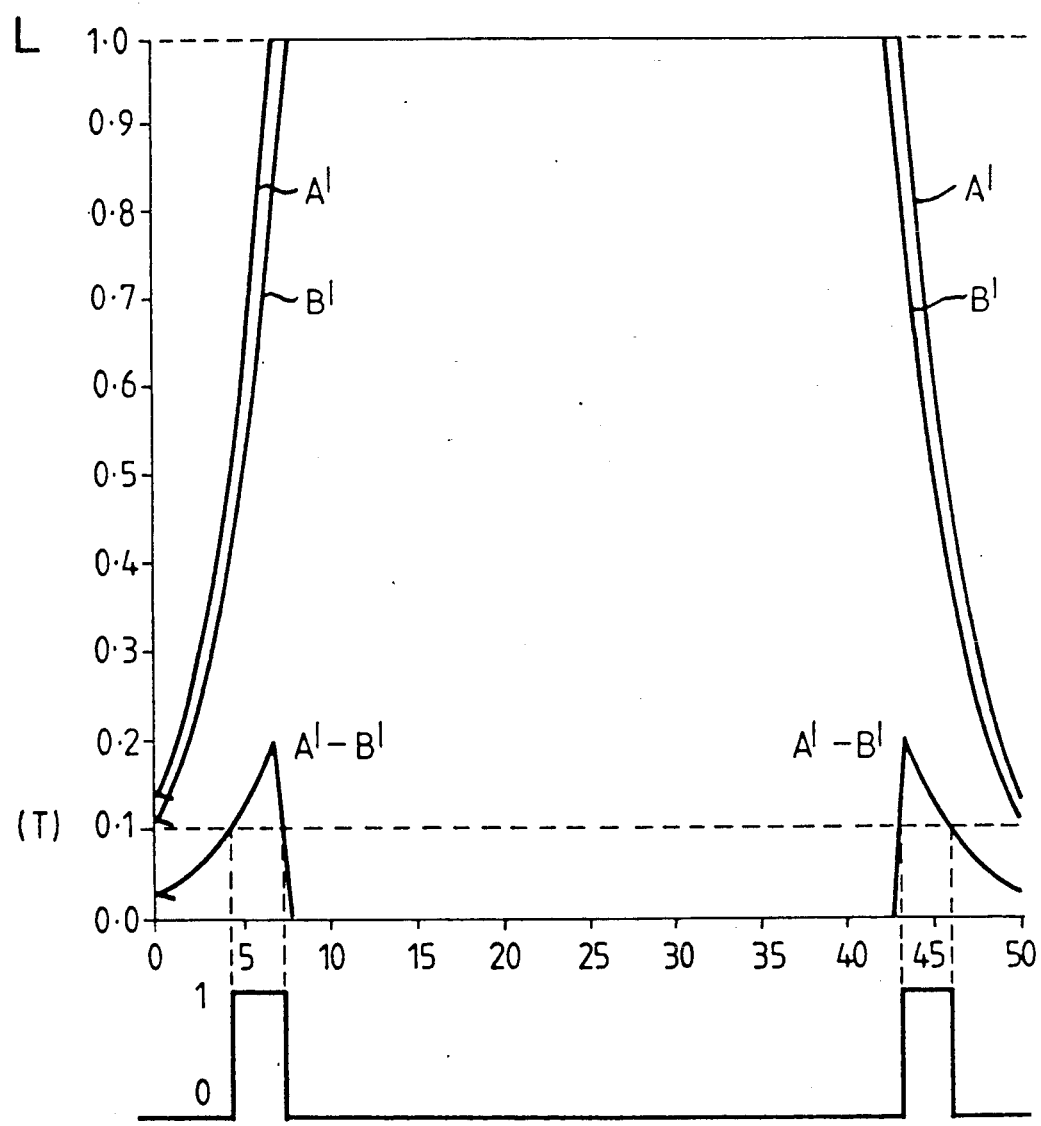

The present invention will now be described by way of example with reference to the accompanying drawings, in which FIG. 1 is of one embodiment of an electrical detector circuit, in accordance with the present invention, the circuit being arranged to detect the presence of a significant difference, and its sense, between the maximum amplitudes of a simultaneous pair of varying input signals, differing from each other only in amplitude, and thereby to detect which input signal has the dominant maximum amplitude, the required detection being made by a consideration of only a lower amplitude part of each input signal, FIG. 2 is a graph of the waveforms of the lower amplitude part of each of two, simultaneous, varying input signals, and of the waveform of a varying signal amplitude resulting from a comparison of the lower amplitude parts of the input signals, and of a possible, corresponding output waveform of the circuit of FIG. 1, FIG. 3 is of another embodiment of an electrical detector circuit in accordance with the present invention, the circuit being arranged to detect which input signal of, at least three simultaneous, varying input signals, has the dominant maximum amplitude, the required detection being made by a consideration of only a lower amplitude part of at least the dominant input signal.

The electrical detector circuit, in accordance with the present invention, and shown in FIG. 1, is to receive simultaneous pairs of varying input signals, which input signals differ from each other only in amplitude. The simultaneous pairs of varying input signals are caused by a common source, to have waveforms of the same shape, and to be in phase with each other.

The simultaneous pairs of varying input signals are provided initially to receivers, not shown, and/or to photodetectors 10 and 11, not comprising part of the detector circuit. Although the simultaneous pairs of varying input signals are supplied to an arrangement including the detector circuit, in accordance with the present invention, together with receivers and/or photodetectors, it is convenient to consider, where appropriate, that the input signals are supplied direct to the detector circuit from a common source.

The arrangement, including the detector circuit, together with receivers and/or photodetectors, normally is required to act on input signals each having a wide dynamic extent, say, of twelve orders. However, usually receivers and photodetectors saturate when in receipt of signals of high levels.

When considering that the simultaneous pairs of varying input signals are supplied direct to the detector circuit, in accordance with one aspect of the present invention, each input signal of a simultaneous pair of varying input signals is supplied individually to two identical limiting amplifiers 12 and 13. In particular, the input of the first limiting amplifier 12 is connected to the output of the photodetector 10, the photodetector to provide a varying input signal A; and the input of the second limiting amplifier 13 is connected to the output of the photodetector 11, the photodetector to provide a varying input signal B.

Each input signal, A and B, conveniently, has a waveform of the general shape of a Gaussian distribution curve in statistics.

For each input signal, of each simultaneous pair of varying input signals, A and B, or at least in relation to the input signal having the dominant maximum amplitude of such a pair of input signals, normally there is expected to be a wide dynamic extent of amplitudes. However, the limiting amplifiers 12 and 13 transmit only a lower amplitude part of each input signal A or B. Because the limiting amplifiers, 12 and 13, are identical, they both saturate when the associated input signal magnitude has the same predetermined value, L, and this value is arranged to be lower than the voltage at which the associated receiver, and/or photodetector, saturate, thereby it being possible, where appropriate, to consider that the input signals are supplied direct to the detector circuit.

Thus, the upper extremity of the range of input signal magnitudes transmitted by either limiting amplifier, 12 or 13, has the value L. The lower extremity of either range of input signal magnitudes transmitted by the limiting amplifiers, 12 and 13, is zero. Between the lower and upper extremities of the transmitted range of amplitudes, each transmitted, lower amplitude part of an input signal, A' or B', varies with the corresponding input signal, A or B.

FIG. 2 shows typical waveforms for the transmitted, lower amplitude parts of the input signals, A' and B', upto the saturation voltage L. The input signal amplitudes are plotted along the ordinate axis of the graph comprising FIG. 2, which ordinate axis is divided into tenths of the saturation voltage L, with the saturation voltage being considered to be one arbitrary unit. Time in nanoseconds is plotted along the abscissa axis of the graph. The waveforms are when the maximum amplitudes of both input signals, A and B, are very much greater than L. Thus, each of the two illustrated waveforms is of a truncated form, generally of the shape of the Gaussian distribution curve in statistics, with the initial, rising edge part, and the final, falling edge part, being the form of a smooth curve. The waveforms are indicated over a period designated zero to 50 nanoseconds. At the beginning, and at the end, of this period the input signal amplitudes are approximately one-tenth of the saturation voltage L.

The transmitted signal A', from the output of the first limiting amplifier 12, is supplied to the non-inverting input of a difference amplifier 14. The transmitted signal B', from the output of the second limiting amplifier 13, is supplied to the inverting input of the difference amplifier 14. The difference amplifier 14 acts as a comparator, comparing one of the transmitted signals, A' or B', with the other transmitted signal.

Thus, in response to each simultaneous pair of input signals, A and B, to the arrangement including the detector circuit and, in particular, in response to each corresponding pair of transmitted signals, A' and B', supplied to the difference amplifier 14, there is provided at the output of the difference amplifier 14 a corresponding varying difference signal, (A'−B'), varying with the instantaneous difference in amplitudes of the pair of modified varying transmitted signals, and hence varying also with the instantaneous difference in amplitudes of the simultaneous pair of varying input signals. The difference signal, (A'−B'), is provided by the difference amplifier 14, until one of the limiting amplifiers, 12 or 13, saturates. When both limiting amplifiers saturate no signal is provided by the difference amplifier. Thus, unless one of the limiting amplifiers is saturated, a varying signal representative of the differences in amplitudes of the varying modified signals, A' and B', is obtained from the difference amplifier 14.

The waveform of the varying difference signal (A'−B'), in relation to the waveforms of the transmitted signals, A' and B', of FIG. 2, is also shown in FIG. 2. The parts of the waveforms as the varying modified transmitted signal amplitudes, A' and B', approach zero are not shown. In particular, in relation to the rising edges of the transmitted signals, A' and B', the initial amplitude of the difference signal (A'−B'), at what is considered to be zero time, is considerably less than the initial amplitude of either transmitted signal, A' or B', both having an amplitude of approximately one-tenth of the saturation voltage L. As the amplitudes of the transmitted signals A' and B' rise at substantially the same varying rate, the amplitude of the difference signal (A'−B') rises at a varying rate until either transmitted signal amplitude reaches the saturation voltage, L. This varying rate is less than the rate of increase of either transmitted signal amplitude, A' or B'. Between the time when the first transmitted, varying, modified signal reaches the saturation voltage, L, and when the other transmitted, varying, modified signal amplitude, B' or A', reaches the saturation voltage, L, the difference signal amplitude (A'−B') decreases to zero at the same varying rate that the transmitted modified signal amplitude approaches the saturation voltage L. The difference signal amplitude (A'−B') remains at zero until, in relation to the falling edges of the transmitted signals, A' and B', the amplitude of either transmitted signal falls below the saturation voltage L. Then the difference signal amplitude (A'−B') rises, until the other transmitted signal amplitude falls below the saturation voltage L. The difference signal amplitude (A'−B') then falls at a varying rate, until the waveforms of the transmitted signal amplitudes A' or B' are considered as terminating, at approximately a value of one-tenth of the saturation voltage L, at a time of 50 nanoseconds. In FIG. 2, the waveforms of the transmitted signals A' and B' and of the difference signal (A'−B'), in relation to the falling edges of the transmitted signals, are the mirror images of the corresponding waveforms in relation to the rising edges of the transmitted signals.

Because the transmitted input signals A' and B' comprise the lower amplitude parts of the corresponding varying input signals, respectively A and B, also, where appropriate, it is convenient to consider each transmitted input signal as the corresponding input signal.

From an examination of the truncated input signal waveforms of FIG. 2, it is indicated that the maximum amplitude of the input signal A is greater than the maximum amplitude of the input signal B. Thus, the varying rate of change of the difference signal amplitude (A'−B'), when neither limiting amplifier is saturated, is positive for the rising edges of the input signals, and is negative for the falling edges of the input signals. If the maximum amplitude of the input signal B is greater than the maximum amplitude of the input signal A, then the varying rate of change of the difference signal amplitude (A'−B'), when neither limiting amplifier is saturated, is negative for the rising edges of the input signals, and is positive for the falling edges of the input signals.

Further, it is convenient to consider either of the varying modified transmitted signals A' or B' as a varying input signal, and the other of the varying transmitted signals, B' or A', as a varying comparing signal, to be compared with the varying input signal. It is immaterial which of the modified signals A' or B' is considered as the input signal, but it is convenient to consider the input signal supplied to the non-inverting input of the difference amplifier 14 as the input signal and to consider the input signal supplied to the inverting input of the difference amplifier 14 as the comparing signal. Hence when the input signal A is supplied to the non-inverting input of the difference amplifier 14 and the maximum amplitude of the input signal A is greater than the maximum amplitude of the input signal B, then the difference signal obtained from the difference amplifier is positive. If the maximum amplitude of the input signal B is greater than the maximum amplitude of the input signal A, then the difference signal obtained from the difference amplifier 14 is negative.

The output of the difference amplifier 14 is connected to the non-inverting input of each of two threshold amplifiers, or comparators, 15 and 16. The inverting input of each threshold amplifier is supplied with a predetermined threshold voltage, indicated in FIG. 1, as having a magnitude T. In particular, the inverting input of one of the threshold amplifiers 15 is supplied with a positive threshold voltage of the predetermined magnitude T; whilst the inverting input of the other of the two threshold amplifiers 16 is supplied with a negative threshold voltage of the same predetermined magnitude T. The magnitude of the threshold voltage, T, is indicated in dotted line form in FIG. 2, as having the magnitude equal to one-tenth of the saturation voltage L. As also is shown in FIG. 2, the threshold amplifier 15, having the positive threshold voltage, +T, supplied to the inverting input thereof, provides a positive-going part of a digital output signal, representative of a logic level 1, in response to a positive signal from the difference amplifier 14, indicating that the maximum amplitude of the varying input signal A is greater than the maximum amplitude of the varying input signal B and that the positive signal from the difference amplifier has a magnitude greater than one-tenth of the saturation voltage L. Not shown in FIG. 2 is the threshold amplifier 16, having the negative threshold voltage −T, supplied to the inverting input thereof, providing a positive-going part of a digital output signal, representative of a logic level 1, in response to a negative signal from the difference amplifier 14, indicating that the maximum amplitude of the varying input signal B is greater than the maximum amplitude of the varying input signal A and that the negative signal from the difference amplifier has a magnitude greater than one-tenth of the saturation voltage L. When the signal from the difference amplifier 14 has a magnitude less than one-tenth of the saturation voltage L or the threshold voltage T, both threshold amplifiers 15 and 16 provide no output signal, representative of a logic level 0.

Because the maximum amplitudes of both the varying input signals A and B are considerably greater than the saturation voltage L of the limiting amplifiers 12 and 13, say, respectively ten times and eight times greater, the rising and falling edge parts of the input signals transmitted by the limiting amplifiers as represented by the waveforms A' and B' of FIG. 2, are steeply inclined to the time axis. Thus, in relation to the limiting case, the waveforms representing the rising and falling edge parts of the input signals comprise straight lines having a constant, large magnitude, slope. Also in relation to the limiting case, the waveform representing the corresponding varying difference signal amplitude, until one limiting amplifier saturates and only substantially as shown in FIG. 2, is less steeply inclined to the time axis than the corresponding slopes of the rising and falling edge parts of the input signals. However, as is apparent from FIG. 2, the waveform representing, at least the varying difference signal amplitude does not have a constant slope but a slope which varies continuously at a significant rate.

Thus, a positive-going part of a digital signal, representative of a logic level 1, provided on an output of one of the threshold amplifiers 15 or 16 indicates which of the input signals A or B has the dominant maximum amplitude in accordance with the present invention. If a positive-going part of a digital signal is not obtained on the output of either of the threshold amplifiers 15 or 16 this is indicative that the varying difference signal amplitude (A'−B') from the difference amplifier 14, in relation to the rising edge parts of the input signals, does not obtain a maximum difference signal amplitude equal to the threshold voltage magnitude T, or one-tenth of the saturation voltage L, of the limiting amplifiers, before one of the limiting amplifiers 12 and 13 saturates. In relation to the falling edge parts of the input signals, the varying difference signal amplitude (A'−B') starts at a magnitude less than the threshold voltage magnitude T, after both of the limiting amplifiers 12 and 13 cease to be saturated.

Possibly only one of the threshold amplifiers 15 or 16 is provided.

If the representation of the varying difference signal amplitude (A'−B') can be considered as having a constant slope, then it is possible to estimate from the time the difference signal amplitude (A'−B') crosses the predetermined threshold value T or one-tenth of the saturation voltage L, the difference between the maximum amplitudes of the varying input signals, A and B.

When a positive-going part of a digital signal is not obtained at the output of either of the threshold amplifiers 15 or 16, indicating that a predertermined value for the maximum difference signal amplitude is not obtained, then it is possible to infer that the difference between the maximum amplitudes of the varying input signals A and B is less than the threshold voltage T. If the approximate value of the maximum amplitude of at least the more dominant one of the two varying input signals is known, then it is possible to estimate the difference, referred to as the significant difference, between the maximum amplitudes of the varying input signals at which the maximum magnitude of the varying difference signal (A'−B') from the difference amplifier 14 just attains the threshold voltage magnitude T, so that a positive-going part of a digital output signal is just obtained from one of the two threshold amplifiers 15 or 16. Hence, it is possible to determine whether or not the difference between the maximum amplitudes of the varying input signals A and B is greater than the predetermined value of the threshold voltage T. If the difference between the maximum amplitudes of the varying input signals A and B is less than such a predetermined value, then it is not possible to determine which of the varying input signals is the more dominant, in accordance with the present invention.

The detector circuit is such that, as a generalisation, if it is required to detect as a so-called significant difference between the maximum amplitudes of a simultaneous pair of input signals a difference of, say, 10% of the dominant maximum amplitude, then the threshold voltage T is required to be 10% of the saturation voltage L of the limiting amplifiers 12 and 13. Further, if the difference between the maximum amplitudes of the simultaneous pair of input signals is, say, 10% of the dominant maximum amplitude, then at any instant during the comparison of the input signals by the difference amplifier 14, there is a 10% difference between the amplitudes of the input signals.

The electrical detector circuit, in accordance with the present invention, and shown in FIG. 3, is to receive simultaneously a plurality n varying input signals, which input signals a, b, c, d . . . n, differ from each other only in amplitude. The waveforms of the varying input signals have the same shape, and the signals are in phase with each other. Usually the common source of the plurality of varying input signals provides only one varying input signal to the detector circuit and, due to cross-talk or leakage or otherwise, each of the other varying input signals provided to the detector circuit comprises a spurious signal. It is required to detect which is the most dominant of the varying input signals, a, b, c, d . . . n, this comprising the signal from the source.

Each of the input signals a, b, c, d . . . n, is supplied individually to an associated one of a plurality n of identical limiting amplifiers 30, each saturating at a voltage L. If a limiting amplifier 30 receives a spurious varying input signal, usually, but not essentially, it transmits the whole of the signal. However, if a limiting amplifier 30 receives the dominant varying input signal from the source, inherently this dominant input signal has such a wide dynamic extent of amplitudes that the limiting amplifier transmits only the lower amplitude part thereof a', or b', or c', or d' . . . or n'. For convenience, the signals transmitted by the limiting amplifiers 30 will be referred to as a', b', c', d' . . . n', even though only the limiting amplifier receiving the dominant varying input signal from the source transmits only the lower amplitude part of the varying input signal it receives. The limiting amplifier 30 receiving individually the varying input signal a, or b, or c, or d . . . or n, transmits a corresponding signal, respectively, identified as, a', or b', or c', or d' . . . or n'.

The varying input signals a, b, c, d . . . n, are also supplied to a summing channel, comprising a summing amplifier 31 the output of which summing amplifier is connected to the positive input of a threshold amplifier 32 having unity gain. A fixed threshold voltage −T is supplied to the negative input of the threshold amplifier 32.

The summing channel 31, 32, and in particular the summing amplifier 31, also is to be considered as including, in effect, a limiting amplifier, not separately identified.

It is required that the summing channel 31, 32 saturates at a voltage L', such that the voltage L at which each limiting amplifier 30 saturates is less than the sum of the voltage L' and the magnitude of the threshold voltage T.

Within the summing amplifier 31, each of a simultaneous plurality of varying input signals a, b, c, d . . . n, is operated upon, so that the corresponding varying output signal from the summing amplifier is representative of the operand and has an instantaneous amplitude related to the sum of the instantaneous amplitudes of the simultaneous plurality of varying input signals.

If the summing channel 31, 32 does not saturate, the varying operand signal from the summing amplifier 31 comprises a real, varying operand signal and has an instantaneous amplitude directly proportional to the sum of the instantaneous amplitudes of the corresponding, simultaneous plurality of varying input signals a, b, c, d . . . n.

If the summing channel 31, 32 does saturate, it can be considered that there is an apparent, varying operand signal from the summing amplifier, considered as having an instantaneous amplitude directly proportional to the sum of the instantaneous amplitudes of the corresponding, simultaneous plurality of varying input signals, a, b, c, d . . . n, even when the instantaneous amplitude of the apparent, varying operand signal should be greater than the saturation voltage L' for the summing channel. The actual, varying operand signal comprises the lower amplitude part of the corresponding, apparent, varying operand signal, below the level L'.

The amplitude of the output signal S' from the summing channel 31, 32 can vary from the magnitude of the fixed threshold voltage T, upto its greatest possible amplitude (L'+T). The maximum amplitude of the varying output signal S' from the summing channel 31, 32 is less than (L'+T) when the summing channel is not saturated.

When the summing channel does not saturate it is considered that the varying output signal S' is a real, varying output signal, comprising the summation of the corresponding, real, varying operand signal, having an instantaneous amplitude directly proportional to the sum of the instantaneous amplitudes of the corresponding, simultaneous plurality of varying input signals a, b, c, d, . . . n, and the magnitude of the fixed threshold voltage T.

However, when the summing channel 31, 32 saturates, it is possible to consider that there is an apparent, varying output signal from the summing channel 31, 32, comprising the summation of the corresponding, apparent, varying operand signal, comprising the instantaneous amplitudes of the corresponding, simultaneous plurality of varying input signals a, b, c, d, . . . n, even when the instantaneous amplitude of the corresponding apparent, varying operand signal should be greater than the saturation voltage L' for the summing channel, plus the magnitude of the fixed threshold voltage T. The actual, varying output signal S' from the summing channel comprises the summation of the lower amplitude part of the corresponding, apparent, varying operand signal, below the level L', plus the magnitude of the fixed threshold voltage T.

The varying output signal S' from the summing channel 31, 32, whether comprising a real, varying output signal; or an actual, varying output signal corresponding to an apparent, varying output signal; comprises a so-called varying comparing signal.

Inherently, the signal having an instantaneous amplitude directly proportional to the sum of the instantaneous amplitudes of the corresponding, simultaneous plurality of varying input signals a, b, c, d, . . . n, and whether comprising a real, or an apparent, varying operand signal; and the corresponding real, or apparent, varying output signal S' from the summing channel 31, 32; can be considered as differing from each of the corresponding, simultaneous plurality of varying input signals, only, in amplitude. This varying output signal S' will be used as a comparing signal in the arrangement of FIG. 3, this comparing signal being variable and derived from the summation of a plurality of input signals unlike the FIG. 1 embodiment wherein the output of each limiting amplifier serves as a comparing signal to compare to the output of the other limiting amplifier.

The output of the threshold amplifier 32 is connected to the negative input of each of a plurality n difference amplifiers 33. The positive input of each difference amplifier 33 is connected, individually, to the output of an associated limiting amplifier 30. Thus each difference amplifier 33 receives each varying output signal S' from the summing channel 31, 32, irrespective of whether the summing channel saturates, or not; and receives, individually, the corresponding varying output signal a', or b', or c' or d' . . . or n' from the associated limiting amplifier 30, such a signal comprising either the lower amplitude part, below the level L, of the dominant, varying input signal, or usually the whole of one of the spurious varying input signals, respectively a, or b, or c, or d . . . or n.

In this manner, the varying output signal S' from the summing channel 31, 32, comprising a so-called varying comparing signal, is compared within each difference amplifier 33 with the varying signal a', or b', or c', or d' . . . or n' from the limiting amplifier 30 associated with the difference amplifier.

The arrangement of the detector circuit is required to be such that, for each of the n simultaneous comparisons made by the difference amplifiers 33, of the varying signals S', and a', b', c', d' . . . n', the output of the difference amplifier 33 connected to the limiting amplifier 30 receiving the dominant, varying input signal from the source provides a different form of signal from the signals provided by the outputs of the other difference amplifiers. In particular, it is required that, irrespective of whether the summing channel 31, 32 saturates or not during the operation of the detector circuit, the difference amplifier 33 connected to the limiting amplifier 30 receiving the dominant varying input signal from the source provides a positive-going part of a digital output signal, representative of a logic level 1, and simultaneously the other difference amplifiers 33 each provide no output signal, representative of a logic level 0.

Whether the summing channel 31, 32 saturates or not, the maximum amplitude of the dominant varying input signal is compared, by the relevant difference amplifier 33, with the maximum amplitude, respectively, of the corresponding apparent or real varying output signal S' from the summing channel. The comparison is made, at least substantially, in the same manner as is described above in relation to FIGS. 1 and 2. Hence, the lower amplitude part of the dominant varying input signal from the source is compared either with the corresponding real varying output signal S' from the summing channel 31, 32; or with the lower amplitude part of the corresponding apparent varying output signal from the summing channel. Thus, the manner of operation of each difference amplifier 33 is equivalent to the manner of operation of the sum of the difference amplifier 14, and a threshold amplifier, 15 or 16, of the detector circuit of FIG. 1.

In the manner indicated below, the maximum amplitude of the apparent, or real, varying output signal S' from the summing channel 31, 32 is arranged to be less than the expected maximum amplitude of the corresponding, dominant, varying input signal a, or b, or c, or d, . . . or n, from the source. Hence, the relevant difference amplifier 33 inevitably provides a positive-going part of a digital output signal, representative of a logic level 1, in response to each comparison between a dominant varying input signal from the source and the corresponding, varying output signal S' from the summing channel 31, 32.

Simultaneously with each comparison of a dominant varying input signal from the source and the varying output signal S' from the summing channel, and irrespective of whether the summing channel 31, 32 saturates or not, the maximum amplitude of the spurious varying input signals supplied from the limiting amplifiers 30 without modification is compared by each associated difference amplifier 33 with the maximum amplitude, respectively, of the corresponding apparent or real varying output signal S' from the summing channel. The comparisons are made in substantially the same manner as is described above in relation to FIGS. 1 and 2. If the summing channel saturates, the lower amplitude part of the apparent varying output signal from the summing channel is compared with each unmodified, corresponding spurious varying input signal. If the summing channel does not saturate, the real varying output signal from the summing channel is compared with each unmodified corresponding spurious varying input signal.

As stated above, it is expected that the maximum amplitude of each of the spurious varying input signals will not be greater than the saturation voltage L of the limiting amplifiers 30. It is also stated above that L is less than the maximum possible amplitude of the varying output signal S' from the summing channel 31, 32 (L'+T), where L' is the saturation voltage of the summing channel, and T is the magnitude of the fixed threshold voltage.

In the manner indicated below, the maximum amplitude of the apparent, or real, varying output signal S' from the summing channel is arranged to be greater than the expected maximum amplitude of each of the corresponding, spurious, varying input signals a, b, c, d, . . . n. Hence, the associated difference amplifiers 33, inevitably, each provides no output signal, representative of a logic level 0, in response to each comparison between a spurious varying input signal and the corresponding varying output signal S' from the summing channel 31, 32.

Consequently it is required that the gain K of the summing amplifier 31 is scaled by an appropriate amount and that the fixed threshold voltage $-T$, supplied to the negative input of the threshold amplifier 32, is set at an appropriate level.

In particular, it is required that the fixed threshold voltage $-T$ is set so that the detector circuit tends not to indicate falsely the presence of noise, comprising the spurious varying input signals referred to above, and within the detector circuit, as a dominant varying input signal. An appropriate threshold-noise ratio in this respect, and when the source of the dominant varying input signal is an electro-optic device, can be calculated using Rice's equation, as discussed at Pages 109 to 113 in the handbook entitled Technical Series EOH-11, published by RCA in 1974.

The instantaneous amplitude of each spurious varying input signal can be considered to be a fraction F of the instantaneous amplitude of the corresponding dominant varying input signal supplied from the source.

Because of the presence of the unity gain threshold amplifier 32 and because of the requirements for the maximum amplitude of the real or apparent varying output signal S' from the summing channel 31, 32 as referred to above, it is convenient for the gain K of the summing amplifier 31 to be scaled so that the maximum amplitude of the corresponding real or apparent varying operand signal from the summing amplifier is equal to the maximum amplitude of each corresponding, spurious varying input signal. Consequently, a convenient set gain of the summing amplifier 31 is, $$K = \frac{1}{\left(\frac{1}{F} + n - 1\right)}$$

The real or apparent varying operand signal is summed by the threshold amplifier 32 with the fixed threshold amplitude T, to provide the corresponding real or apparent varying output signal S' from the summing channel.

Consequently, the maximum amplitude of the real or apparent varying output signal S' from the summing channel 31, 32 is arranged to be greater than the maximum amplitude of each corresponding spurious varying input signal; and, because of the selection of an appropriate threshold-noise ratio, to be less than the maximum amplitude of the corresponding dominant varying input signal from the source; as is required.

Any suitable operation may be performed within the detector circuit upon the plurality of varying input signals, instead of the summation performed by the summing amplifier 31, the detector circuit including the appropriate means, instead of the summing amplifier, to perform the desired operation.

The input signals to the detector circuit of FIG. 3 may be divided into groups and only one such constituent group is operated upon within the detector circuit at any time; or the detector circuit may have constituent parts, each such constituent part being substantially as described above with reference to FIG. 3 and such parts to operate individually on the groups of input signals.

It is not essential, for either of the illustrated embodiments, that each of the limiting amplifiers individually receiving a varying input signal, saturates at the same voltage.

I claim:

1. An electrical detector circuit arranged to detect which of a plurality of simultaneous varying input signals has a dominant maximum amplitude, the input signals being expected to have a wide dynamic range of amplitudes relative to whichever of said input signals has the dominant maximum amplitude and differing from one another only in amplitude, which detector circuit includes a separate limiting amplifier associated with each input signal and arranged to provide an output signal having an amplitude limited, when saturation of the amplifier occurs, to a value less than the said dominant maximum amplitude, and comparison means for comparing each said output signal with a variable comparing signal which differs from each input signal only in amplitude, said comparison means providing at least one output indicative of which of the simultaneous input signals has the dominant maximum amplitude.

2. A circuit as claimed in claim 1 which includes means for deriving the variable comparing signal from the summation of the plurality of input signals, the output of each limiting amplifier being connected to a separate one of a like plurality of difference amplifiers to each of which is applied the variable comparing signal, the arrangement being such that one only of the difference amplifiers produces a signal indicating that the input signal having the dominant maximum amplitude is the input signal associated with said one difference amplifier.

3. An electrical detector circuit arranged to detect which of at least two simultaneous varying input signals has a dominant maximum amplitude, the input signals being expected to have a wide dynamic range of amplitudes relative to whichever of said input signals has the dominant maximum amplitude and differing from one another only in amplitude, which detector circuit includes a separate limiting amplifier associated with each input signal and arranged to provide an output signal having an amplitude limited, when saturation of the amplifier occurs, to a value less than the said dominant maximum amplitude, and comparison means for comparing each said output signal with a comparing signal, said comparison means providing at least one output indicative of which of the simultaneous input signals has the dominant maximum amplitude.

4. A circuit as claimed in claim 3 in which said detector circuit is arranged to detect exactly two simultaneous varying input signals, there being only two limiting amplifiers associated with the two input signals, and wherein said comparison means compares the output signal of one of said two limiting amplifiers with the output signal of the other of said two limiting amplifiers, the output signal of each limiting amplifier serving as the comparing signal to the output signal of the other limiting amplifier.

5. A circuit as claimed in claim 3 wherein said comparison means compares each said output signal with a comparing signal which is variable and which differs from each input signal only in amplitude, and wherein the circuit is arranged to detect which of a plurality of more than two simultaneous varying input signals has a dominant maximum amplitude, there being more than two limiting amplifiers.

* * * * *